United States Patent [19]
Dexter et al.

[11] 4,208,760
[45] Jun. 24, 1980

[54] APPARATUS AND METHOD FOR CLEANING WAFERS

[75] Inventors: Jeffrey L. Dexter, North Dartmouth; William E. Fairweather, Mattapoisett; Harold R. Shurtleff, Buzzards Bay, all of Mass.

[73] Assignee: Huestis Machine Corp., Bristol, R.I.

[21] Appl. No.: 861,989

[22] Filed: Dec. 19, 1977

[51] Int. Cl.² .............................................. A46B 13/04
[52] U.S. Cl. ................................... 15/302; 15/306 B; 15/308; 134/79; 134/133; 211/41
[58] Field of Search .................. 15/302, 306 R, 306 A, 15/306 B, 308, 21 D, 21 C; 134/78, 79, 133, 149, 201; 211/41

[56] References Cited

U.S. PATENT DOCUMENTS

| | | | |
|---|---|---|---|
| 3,479,222 | 11/1969 | David et al. ................... | 15/302 X |
| 3,585,668 | 6/1971 | Jaccodine et al. ............. | 15/21 D |
| 3,641,618 | 2/1972 | Rainey et al. ................. | 15/312 R |
| 3,748,677 | 7/1973 | Frank et al. ................... | 15/21 D |
| 3,939,514 | 2/1976 | Cook ............................. | 15/21 C |
| 3,970,471 | 7/1976 | Bankes et al. ................. | 134/80 X |

Primary Examiner—Christopher K. Moore
Attorney, Agent, or Firm—Salter & Michaelson

[57] ABSTRACT

Apparatus and method in which a number of thin, disclike wafers are moved in an arcuate path while supported in a generally upright position. While so supported, the wafers are indexed between a plurality of cleaning stations which may include a scrub station, a scrub rinse station, a rinse station, and a dry station. In the scrub rinse and/or scrub station, the wafers are rotated while contacted on opposite surfaces thereof by a pair of rotating brushes disposed in a closed position, which brushes may be moved to an open position to accommodate movement of the wafers therebetween. Furthermore, a bracket of unique construction serially moves the wafers into the travel path. Means for introducing the wafers to the path and for removing them therefrom are further included.

29 Claims, 16 Drawing Figures

APPARATUS AND METHOD FOR CLEANING WAFERS

BACKGROUND OF THE INVENTION

This invention relates to apparatus and method for cleaning thin, disc-like wafers of material, and more particularly, a method and apparatus for thoroughly cleaning semiconductor materials prior to further processing. In the manufacture of semiconductor elements, the individual wafers are cut from a billet (elongated crystal) of material into very thin wafers which are ultimately cut into small pieces to form diodes and other electronic elements. After the wafers are cut from a billet, during which operation cutting lubricants are utilized, they are then lapped and polished. During such processes, the residual lubricant film, as well as particles of the semiconductor material removed by polishing, etc. remain on each surface of the wafer. These materials must be totally removed prior to further processing of the wafers. Typical wafer materials are silicon and germanium.

The scrubbing or cleaning of the wafers may be accomplished by placing each individual slice or wafer in a carrier which then moves or otherwise positions the wafer with respect to one or more scrubbing brushes and/or other cleaning mediums. The wafers so supported are generally indexed through a series of cleaning stations. Representative of prior art devices utilized to accomplish the above are the following U.S. Patents:

U.S. Pat No. 3,585,668; Jaccodine et al 6/2/69
3,664,872; Frank et al 5/23/72
3,691,694; Goetz et al 9/19/72
3,748,677; Frank et al 7/31/73
3,915,739; Maahs et al 10/28/75
3,921,796; Bok et al 11/25/75
3,939,514; Cook; 2/24/76
3,970,471; Bankes et al 7/20/76

Despite the existence of the above-indicated equipment, there still exists a need for a method and apparatus which can thoroughly scrub and otherwise clean all the surfaces of such wafers in a thorough, efficient manner while not needlessly exposing such wafers to flexure stresses as can be imparted thereto by movement into and out of contact with rotating brushes and the like. It is accordingly a primary object of the present invention to provide an apparatus and method for cleaning wafers of the type hereinunder consideration wherein the wafers are held in a unique manner so as to expose all the surfaces thereof as by a bracket capable of being indexed through a plurality of cleaning stations arranged in an arcuate path and then discharged therefrom in a condition which enables the thus treated wafers to be immediately further processed.

Another object of the present invention is the provision of an apparatus and method of cleaning wafers which is flexible enough in its manner of use that a large variety of types and sizes of wafers may be processed thereby in a straightforward and trouble-free manner conducive to low-cost operation.

A still further object of the present invention is the provision of an apparatus and method for cleaning wafers of the type hereinunder consideration to be subjected to minimal acceleration and flexure stresses during processing so as to enable such wafers to be processed with a minimum of breakage thereof.

A still further object of the present invention is the provision of an apparatus and method for conveying the wafers hereinunder consideration into and out of the processing path of the present invention. Accordingly, their handling during such processing as by machine operators or inspection equipment is both minimized and capable of essentially complete automation so as to present both completely cleaned and dried semiconductive wafers in a form immediately usable for further processing.

These and other objects of the present invention are accomplished by supporting the wafers to be cleaned in an upright generally vertical position. In such position, they are contacted preferably at two spaced locations at both their leading and trailing edges. Thereafter, the wafers are indexed through a plurality of cleaning stations. At least one of the cleaning stations includes a pair of generally parallel brushes mounted for rotation along axes parallel to each other and a plane passing through such travel path. The brushes may be moved to an open position to enable the wafers to be positioned therebetween and a closed position wherein the brushes simultaneously contact both sides of the wafer in a scrubbing action while the wafer is independently rotated so as to enable scrubbing action to reach all surfaces of the wafer. The path is in part defined by an arcuate track, in turn including means for independently rotating the wafer at the scrub stations. Furthermore, the brushes move so as to establish an operative relationship between the wafer and the independent means for rotating such. Additionally, a scrub rinse, a rinse, and a dry station may be additionally provided along the path and the path is appropriately interrupted at opposite ends thereof so as to enable the wafers to be serially moved thereto and removed therefrom.

Other objects, features and advantages of the invention shall become apparent as the description thereof proceeds when considered in connection with the accompanying illustrative drawings.

DESCRIPTION OF THE DRAWINGS

In the drawings which illustrate the best mode presently contemplated for carrying out the present invention.

DESCRIPTION OF THE INVENTION

Figures 1, 2:
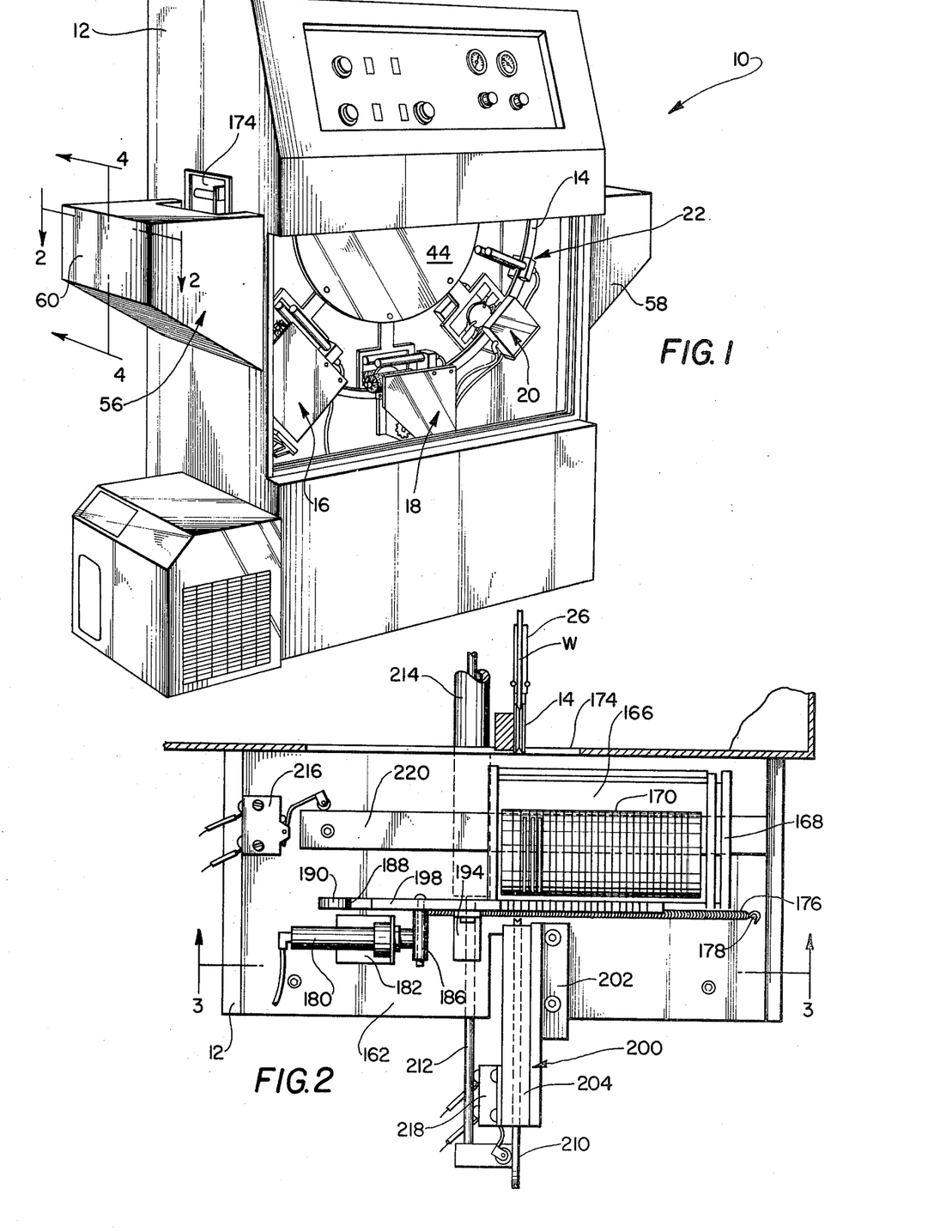
FIG. 1 is an overall perspective view of a wafer cleaning device embodying the several features of the present invention.
FIG. 2 is a plan view of a portion thereof taken along the line 2—2 of FIG. 1, and in particular, showing the load station thereof.
Figure 15:
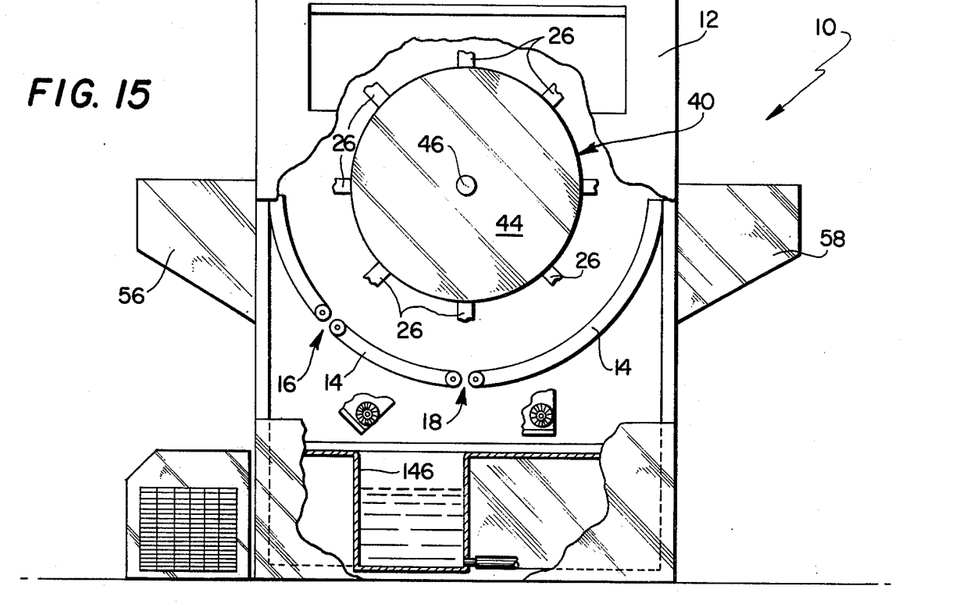
FIG. 15 is a front elevational view similar to FIG. 1, with parts removed and broken away for clarity.

Turning now to the drawings and in particular FIGS. 1 and 15 thereof, the overall configuration of the wafer cleaning device 10 of the present invention is shown. Such includes an overall frame or housing 12 in turn supporting an arcuately shaped track 14 disposed between opposite sides thereof. The track in turn defines the travel path through which wafers W may serially pass. Such path includes a scrub station 16, a scrub rinse station 18, a rinse station 20 and a dry station 22 wherein the wafers are sequentially scrubbed, rinsed and dried on all surfaces thereof so that they are thereafter ready to be further processed.

The frame 12 includes an open face portion 24 which may be closed as by sliding glass doors such that the various cleaning sequences performed upon the wafers may be readily observed and access thereto for adjustment, repair, etc. may be readily had.

The wafer W is of thin, generally disc-like configuration having leading and trailing edges L and T, respectively. The wafers are supported by a bracket assembly 26 in an upright position which is substantially parallel to a plane passing through the track 14. The bracket assembly includes an arm 28 of substantially U-shaped configuration having a base 30 and opposite side arms 32 outwardly extending therefrom. A pair of fingers 34 inwardly extends from each of the opposite side arms 32 and terminates in substantially V-shaped bifurcated portions 36 separated from each other and preferably provided with an outer coating of a material such as polypropylene or polyurethane so as to assure that metal surfaces do not come in contact with the wafer W during its processing. The terminal portions of the finger extension 34 are each provided with a pad 38 also formed from a plastic resinous construction and from which the bifurcated terminal element or contact fingers 36 extend in pairs in spaced relationship to each other such that the circumferential edges of the wafer W may contact the pads 38, and so as to insure that the wafer will not be wedged or otherwise hung up between a pair of contact fingers 36. The above indicated plastic surfaces also give good wearability and desirable low frictional contact with the wafers W.

It is particularly desirable to incorporate two pair of contact fingers 36 on both the leading and trailing edges of the wafer to securely position the wafer within the bracket assembly 26 particularly when initially loaded thereinto or removed therefrom as well as while it is being processed through the various aforementioned cleaning stations as will hereinafter be more apparent. The base 30 is spaced from the finger 34 sufficiently to not only accommodate various sized wafers, but also to form a space 39 between the inside edge of the wafer and such base for a purpose which will hereinafter be more evident.

The bracket assembly 26 is in turn connected to an indexing mechanism 40 by means of an arm 42. The indexing mechanism 40 includes a circular plate 44 positioned radially inward from the track 14 and rotatable about a central shaft 46 which may also be radially central of the track 14. A plurality of such bracket assemblies 26 are provided along the circumference of the plate 44 and are connected thereto as by bolts 48 or other conventional means. The plate 44 is rotatably driven by means of a constantly driven A.C. gear motor 50 and a cam drive assembly which enables a wafer held by a particular bracket assembly 26 to be appropriately positioned in any one of the cleaning stations for a desired length of time for processing therein. Timing means (not shown) may be provided so as to regulate the time increment in which the wafer is positioned in any one or several of the cleaning stations.

Figure 4:
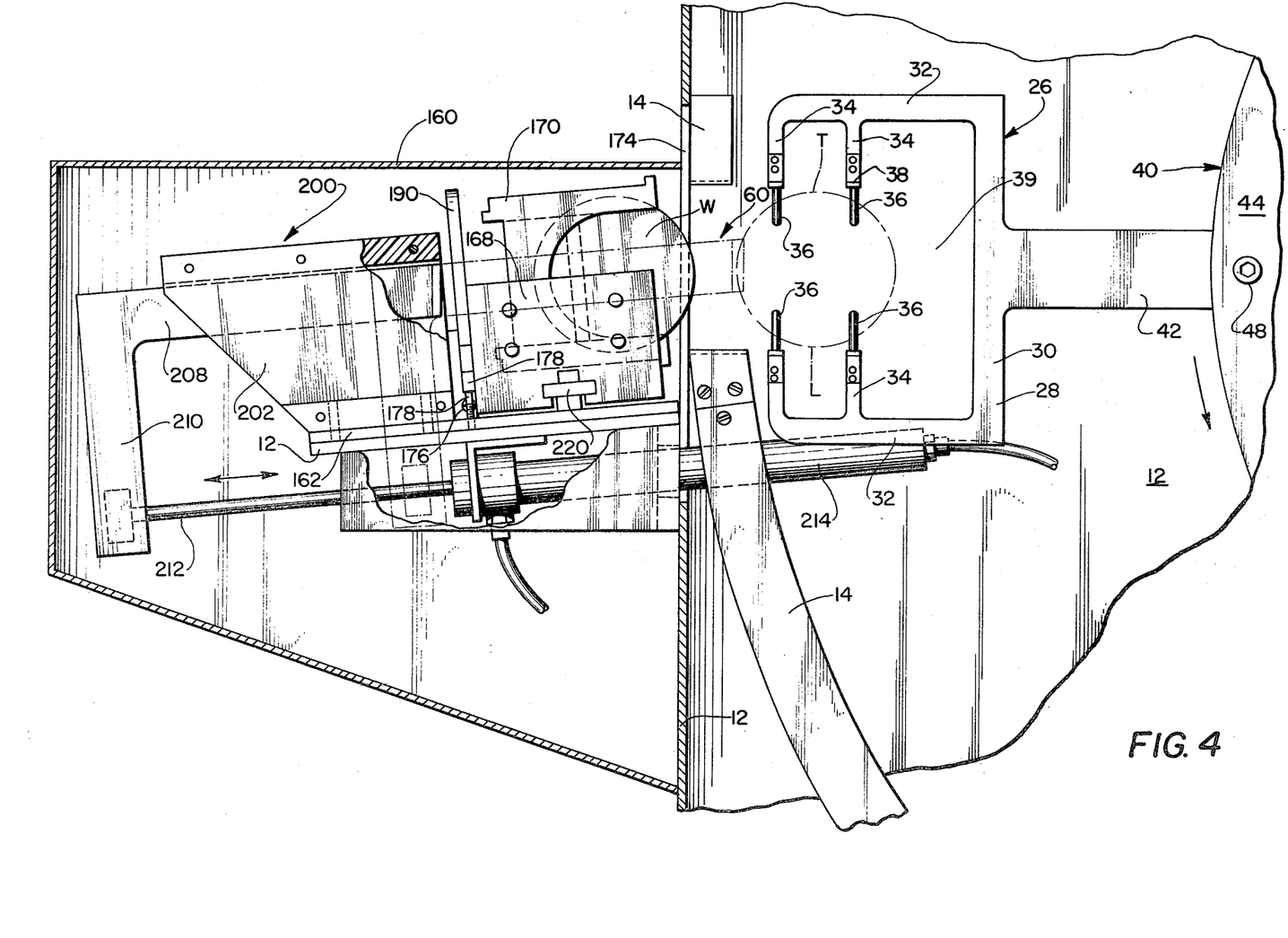
FIG. 4 is a partial sectional view taken along the line 4—4 of FIG. 1, and shows in particular, the manner in which the loading mechanism functions to dispose wafers in position to be cleaned by the several cleaning stations incorporated in the present device.
Figure 5:
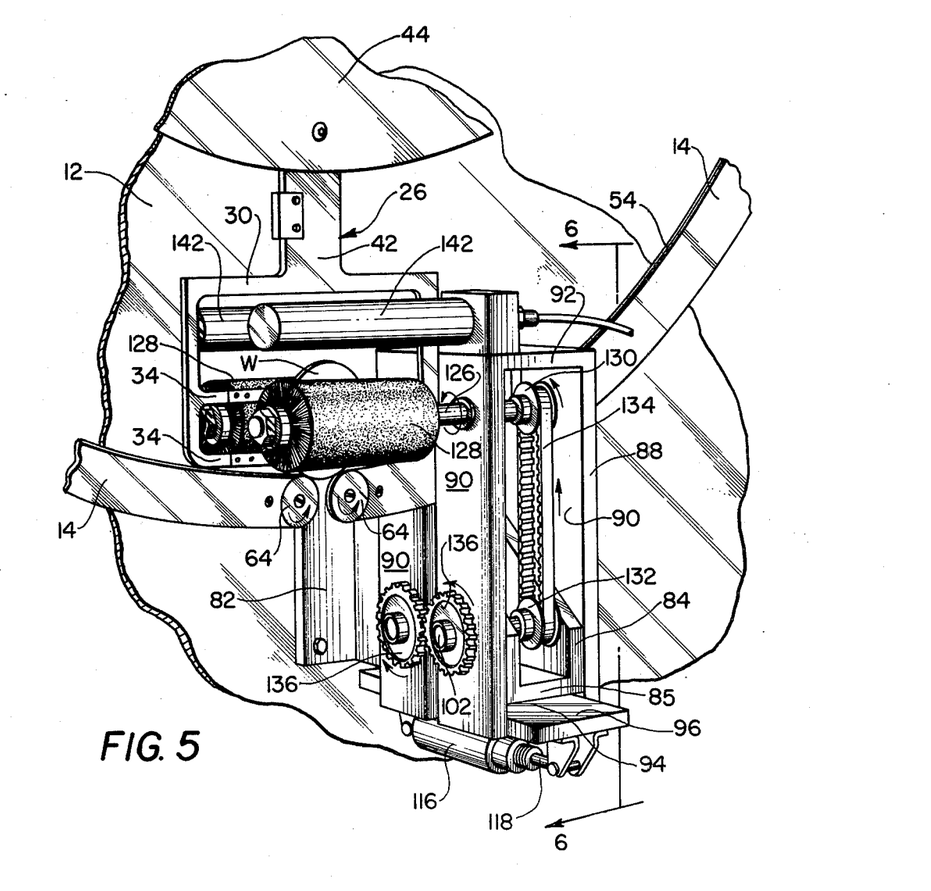
FIG. 5 is a partial perspective view of a scrub station constructed in accordance with the present invention disposed in its closed operative position.
Figures 6, 7:
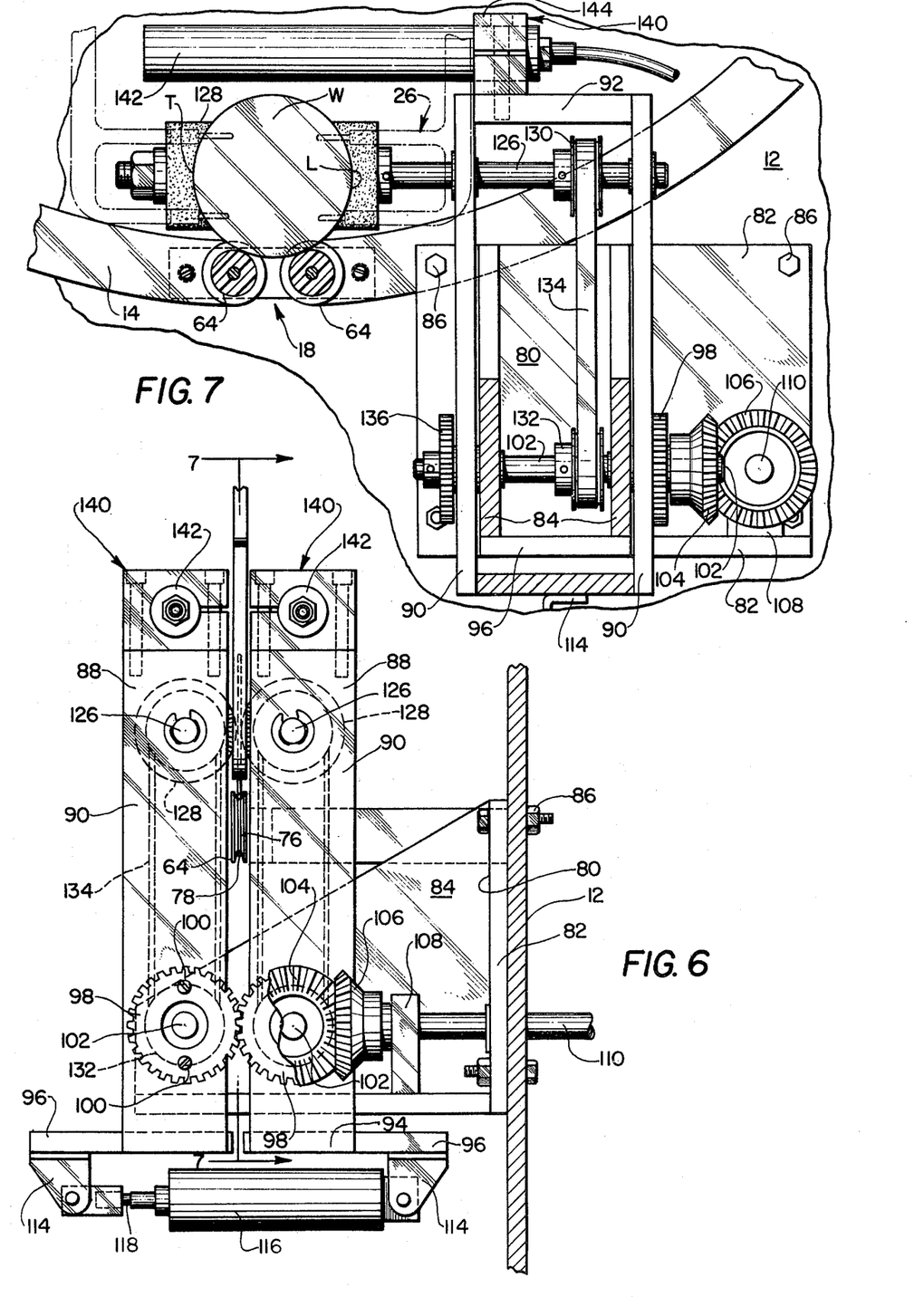
FIG. 6 is an elevational view taken along the line 6—6 of FIG. 5.
FIG. 7 is a partial sectional view taken along the line 7—7 of FIG. 6.

The track 14 as may be seen by simultaneous reference to FIGS. 4, 5, and 15 of the drawings, is in the form of an elongated, flat strip having a groove 54 in its inner peripheral edge. The groove is of a width and depth so as to cooperatively support the edge of the wafer positioned therein as the bracket assembly 26 indexes such wafer through the various cleaning stations. The track may terminate or be broken adjacent a load station or assembly 56 and an unload or discharge assembly 58 as by guide openings 60 and 62, respectively. Additionally, the track 14 is interrupted both at the scrub station 16 and the scrub rinse station 18. Adjacent the interrupted track portions, a pair of wheels 64 are positioned adjacent to and spaced from each other. The wheels are mounted for simultaneous rotation in the same direction by means of wheel drive means 66, including a motor 68 appropriately mounted to the frame 12 by conventional means and from which a pair of belts 70, 72 are operationally trained over pairs of drive wheels 74 positioned in back of each wheel 64. Each of the drive wheels 64 is provided with a circumferential groove 76 in which a drive ring 78 is disposed. The drive ring is formed of flexible rubber-like material, and an O-ring may be used for this purpose.

Accordingly when the wafer W is positioned in either the scrub or scrub rinse station 16, 18 respectively, it is contacted at spaced lower peripheral portions thereof by such drive ring 78 and/or drive wheels 64 such that the wafer is cooperatively positioned in a stable attitude between the drive wheels 64 and the bracket assembly 26. In this regard it should be pointed out that during most of its arcuate travel path, the wafer is so cooperatively supported inasmuch as it is free by gravity to move downwardly out of the open front end defined by the U-shaped arm 28. However, during its travel through the cleaning stations, such outward radial movement of the wafer W is prevented by the track 14 or drive wheels 64. On the other hand, as will be hereinafter more clearly brought out, the wafer is supported solely by the bracket assembly 26 when such is positioned in or adjacent such load and discharge stations.

Scrub and Scrub Rinse Stations

Reference is now made to the scrub and scrub rinse stations 16, 18 respectively. Such are particularly shown by FIGS. 1 and 5–8 of the drawings. These stations are structurally the same, however, they are included as two separate stations so as to increase the flexiblity of the machine 10 to process wafers in a variety of cleaning modes best suited to the particular type and condition of wafers to be processed. Both the scrub and scrub rinse stations or assemblies 16, 18 include an inner frame member 80, including a back plate 82 and a pair of generally trapezoidally shaped side plates 84 forwardly extending therefrom. The inner frame 80 is secured to the overall frame 12 by means of bolts 86 or other conventional means. A pair of outer frames 88 are positioned with respect to the inner frame 80 such that the outer frames 88 are positioned in spaced adjacent relationship to each other. The outer frames 88 are each of box-like configuration having spaced vertical walls 90 connected to each other at opposite ends thereof by an upper wall 92 and a lower wall 94. The lower wall includes an outwardly extending shelf portion 96 for a purpose which will hereinafter be more apparent.

The inner frame 80 is disposed below the track 14 and the outer frames 88 connected to the inner frame in such a manner that they upwardly extend and are spaced on opposite sides of the frame 14. That is, a space is provided between the outer frames 88 and the frame 14 extends within said space. The spacing between the outer frames 88 is regulated by a pair of fixed gears 98, each positioned on one outer sidewall 90 in adjacent contacting position with each other. The gears 98 may be attached to the respective outer surfaces of the sidewalls 90 by means of screws 100 such that at least one of the fixed gears may be arcuately and laterally adjusted towards and away from the other of the fixed gears 98. In this way, the spacing between the outer frames 88 can be varied.

A pair of drive shafts 102 which are coaxial with the fixed gears 98 span the interior portions of both the outer frames 88 and that portion of the inner frame 80 extending therebetween. In this manner, the drive shafts 102 serve to interconnect the two outer frames to the inner frames 80 in such a manner that pivotal action between both of the outer frames 88 with respect to each other and to the inner frame 80 is possible. The drive shafts 102 are appropriately journalled or otherwise supported for rotation relative to the sidewalls 84 and 90. Additionally, one of the shafts 102 is provided with a bevel gear 104 longitudinally spaced therefrom and fixedly connected to its drive shaft 102. In this respect, it should be pointed out that the drive shaft 102 is not connected to the fixed gears 98 but merely passes through the centers thereof.

Figure 16:
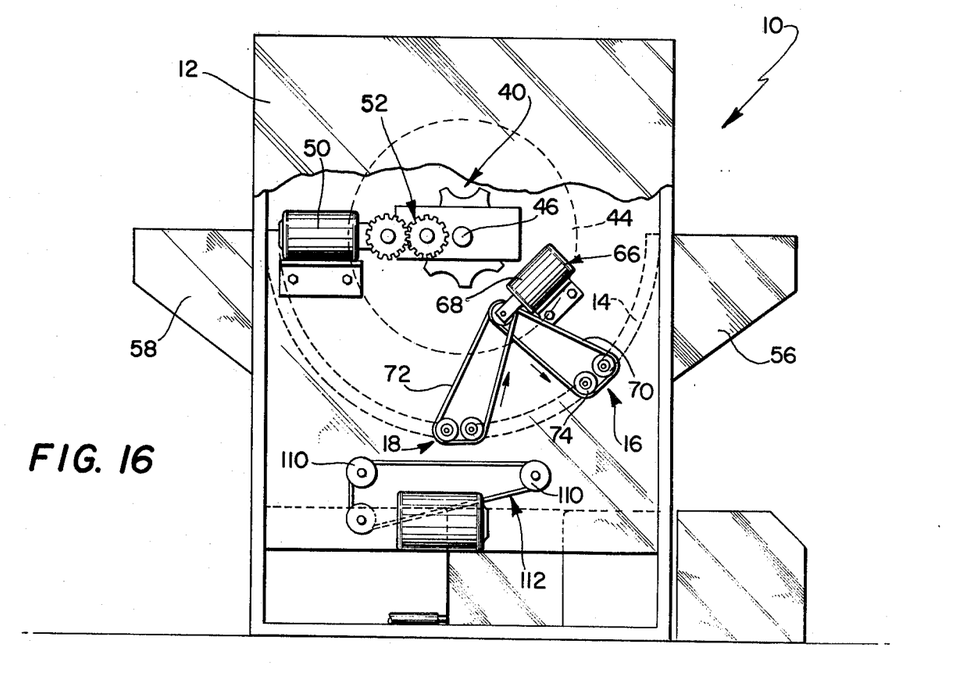
FIG. 16 is a rear elevational view with parts broken away and removed for clarity of the overall apparatus shown in FIGS. 1 and 15 of the drawings.

A drive gear 106 supported from an arbor 108 is positioned for driving engagement with the bevel gear 104 by means of an additional drive shaft 110 in turn connected thereto and journalled through the rear wall 82 of the inner frame 80 and through the housing 12. Such additional drive shaft 110 is suitably connected to a scrub and scrub rinse drive station 112 also suitably secured to the rear of the housing 12 as best shown in FIG. 16.

Each of the outwardly extending shelves 96 is provided with a pair of downwardly extending ears 114 to which the opposite ends of a double acting cylinder 116 are connected. The cylinder 116, by reciprocal movement of its shaft 118, causes the lower portions of the outer frame 88, that is, the bottom walls 94 thereof, to be moved towards and away from each other. Such movement simultaneously causes the outer frames 88 to pivot with respect to each other and the inner frame 80 about pivotal axes formed by the shafts 102. The rotational movement of the outer frames 88 inherent in such pivotal action is accomodated by a rocking engagement or slight arcuate movement between the fixed gears 98. Additionally, the inner edges of the bottom walls 94 are spaced from each other a distance such that then the lower portions of the outer frames move together, the edges thereof form a stop so as to in turn regulate the maximum distance which the upper ends of the outer frame may be moved apart from each other. The minimum spacing between the upper ends of the outer frames 88 may be regulated by an upper adjustment means 120 in the form of a fixed contact 122 and a movable screw contact 124. Naturally, such minimum spacing between the upper ends of the outer frame members 88 accomodates the movement of the track 14 as well as the indexing bracket assembly 26 therebetween.

Furthermore, each of the outer frames 88 is provided with a pair of parallel longitudinally orientated first shafts 126 suitably journalled for rotation between the sidewalls 90 thereof. Each free end of such shafts 126 is provided with a brush 128. The brushes 128 are positioned adjacent but spaced apart from each other and adjacent an opposite surface of the wafer W while the wafer is positioned in either of the scrub stations 16, 18. The brushes 128 are adapted to be driven rotatably downwardly towards each other so as to assure that the wafer will be maintained in contact with the driving roll 64 and will not be otherwise forced out of the track. The wafer is thus also rotated in the plane of the track 14 and thus presents all possible surfaces thereof for contact with the rotating brushes 128.

In order to rotate the brushes, the first shaft 126 and drive shaft 102 of each pair thereof disposed between the outer frames 88 are interconnected to each other by means of spur gears 130 and 132 respectively, over which a drive belt 134 is trained. Additionally, each of the drive shafts 104 includes a rotatable gear 136 fixed thereto and positioned on the outer surface of the sidewall 90 opposite to that which the fixed gears 98 are positioned. The pair of rotatable gears 136 are adapted to mesh with each other and rotate upon rotation of that drive shaft 102 interconnected to the drive means 112 through bevel gear 104. Thus, rotation of one of the drive shafts 102 simultaneously rotates the other of the drive shafts 102 via the meshed rotating gear pair 102 which in turn simultaneously, by means of the drive belts 134, rotates each of the first shafts 126 and accordingly the brushes 128. Such brush rotation is downwardly towards each other so as to, as previously indicated, assure contact with the wafer W with the drive rolls 64. Such brush rotation may also be continual inasmuch as previously explained, the outer frames 88 in which the brushes 128 are mounted, may be moved between a closed first position in which the spacing between the frames 88 may be adjusted so as to provide the necessary brush contact with opposite surfaces of the wafer W to a second open position wherein the frames are pivoted away from each other a distance so as to allow wafers W to be indexed therebetween without contact from the rotating brushes. This action insures that the delicate and fragile wafers will not be excessively accelerated on contact with rotating brushes in a longitudinal travel direction or undesirably flexed upon such initial contact. Instead, the initial contact with the rotating brushes is after they are positioned between the brushes and thus longitudinally along full opposite side surfaces thereof. This unique action avoids the undesirable flexure present in prior art devices.

Each of the scrub and scrub rinse stations 16, 18 respectively, may further be provided with a liquid application assembly 140, which includes a pair of tubes 142 mounted above and in similar disposition to that of the brushes 128 by a bracket 144 or other known positioning means. Each of the tubes 142 is provided at the opposite end thereof with a connection for a liquid medium such as detergent or rinse solution depending on the particular station in which such tubes are operative so as to direct a flow of such liquid downwardly upon the opposite surfaces of the wafer W. Small openings (not shown) are provided within the lower surfaces of the tubes 142 for such purposes. Detergent or rinse solution from either of the stations 16, 18 may be drained or otherwise directed to a sump 146 from which it may be recycled or otherwise disposed of.

Rinse and Dry Stations

Figures 8, 9:
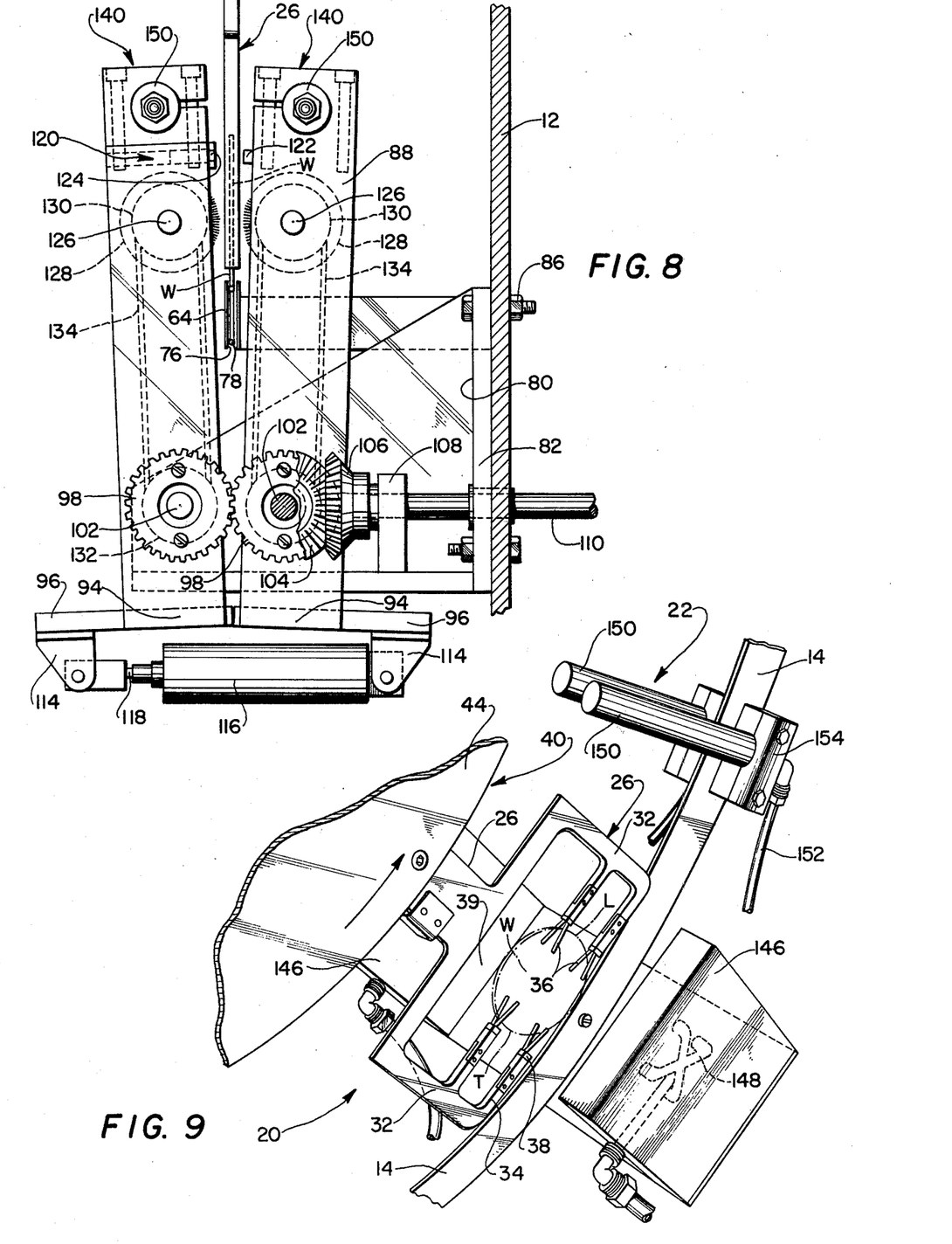
FIG. 8 is a view of the scrub station similar to FIG. 6, but in an open position.
FIG. 9 is a perspective view showing in particular the construction of the rinse and dry stations of the present invention.

The construction of the rinse station 22 is best shown by reference to FIG. 9 of the drawings in which a pair of rinse blocks or pads 146 is shown disposed on opposite sides of the track 14. The bracket assembly 26 holding the scrubbed and scrub rinsed wafer W may then be indexed between the rinse pads 146 and rinsing or other treatment liquid directed generally normally onto opposite side surfaces of the wafer W. A plurality of channels 148 for directing liquid as above-indicated may be provided for such purpose. Furthermore, since the pattern of such rinsing liquid may be easily controlled, it is not necessary that the wafer W be rotated in the plane of the track 14 during the treatment in the rinse station 20. Thereafter, the bracket 206 with the thus rinsed wafer supported therein, is indexed to the dry station 22.

Such station includes a pair of upright tubes 150 positioned on opposite sides of the track 14. The tubes include a plurality of longitudinally aligned openings (not shown) disposed through the tubes and projecting towards the rinse station through which drying gas such as air or nitrogen may be directed preferably in a low angular direction across opposite sides of the wafer W. Such action forces all liquid remaining on the surface of the wafer W to be driven therefrom so that liquid is prevented from evaporating while on the wafer surface and accordingly undesirably depositing contaminants dissolved in such liquids on the surface. The gas is directed from hoses 152 to supporting blocks 154 and then to the aligned openings of the tubes 150.

While both the rinse and dry stations have been shown as stationary with respect to the track 14, it should be brought out that either or both of such stations may be movable. For instance, the rinse pads 146 may be supported so as to move arcuately along the track 14 in a back and forth reciprocal motion to assure a complete rinse of wafers W held by a bracket assembly 26 while such assembly is either stationary or moving with respect to the track. Similarly, the dry tubes 150 could be mounted for such alternate movements.

Wafer Load Station

Figure 3:
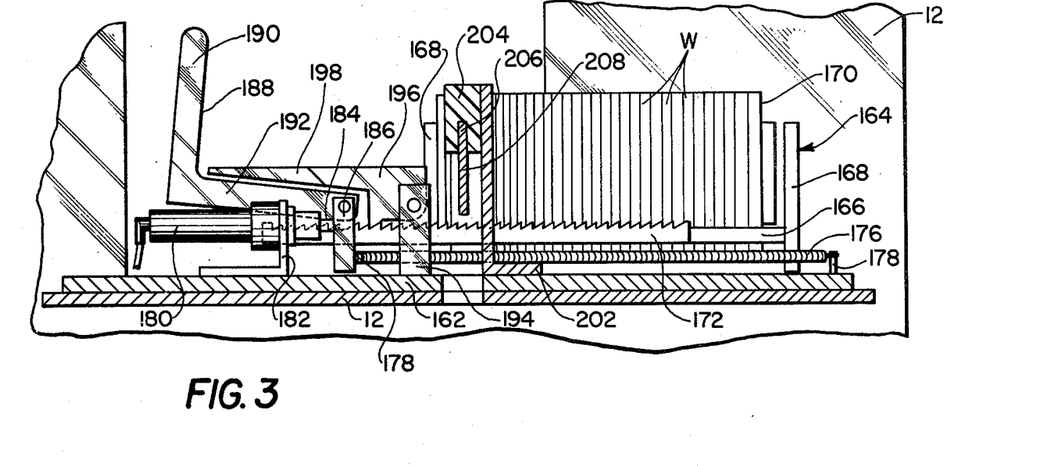
FIG. 3 is a side elevational view of FIG. 1 and also particularly shows the construction of the load station.

The load station 56 includes a cover 160 which when removed exposes a shelf 162 on which a wafer indexing or positioning assembly 164 is supported. The positioning assembly 164 includes a tray 166 having opposed upright members 168 for support of a cassette 170 containing a plurality of adjacently disposed upright wafers W. A toothed rack 172 is positioned against and fixedly attached to that edge surface of the tray 166 distal from the main housing 12 of the device 10, that is, opposite to an opening 174 provided within the housing and through which the positioning assembly 164 may operate so as to position wafers serially into position with respect to the bracket assemblies 26 as they are indexed through the machine. The individual teeth of the rack are flat and generally present an upwardly inclined surface and a generally vertical adjacent surface. The entire tray 166 is continually urged in a first direction by means of a spring 176 connected at one end thereof to the shelf 162 by means of a post 178 and at the other end thereof to the rack 172 by means of a bolt or other means 178.

A double acting cylinder 180 operable as by air pressure is mounted to the shelf 162 by means of a bracket 182. The forward end of a piston 184 of such cylinder 180 includes a plate 186 secured thereto. The plate 186 in turn serves to pivotally support a generally L-shaped first pawl 188. The first pawl includes a handle 190 and a body portion 192 from which a downwardly extending tooth (not shown) is adapted to engage the forward and generally vertically orientated surface of one of the teeth of the toothed rack 172. Disposed adjacent the plate 186 is a support or arbor 194 to which a second pawl 196 is pivotally attached. The second pawl includes a handle portion 198 adapted to overlie a portion of the body section 192 of the first pawl 188. Both of the pawls are free to pivot about their pivot points as by gravity such that when the double acting cylinder moves initially in a first direction or as to the right as shown in FIG. 3, the tooth of the first pawl will ride over the upwardly slanted tooth portion of the rack 172 and thereafter after having traveled the distance equivalent to the width of one of the rack teeth, drops into engagement with the upright or vertically orientated tooth surface thereof. Upon reciprocal travel of the cylinder 180 in the opposite direction (to the left as shown in FIG. 3), the first pawl tooth through its engagement with the rack 172, pulls the rack to the left and accordingly indexes one of the wafers W in alignment with the open face of the U-shaped bracket 28 positioned on the other side of the track 14 adjacent opening 60 thereof. Also, although the rack 172 is continually urged to the right by the spring 176, such motion is prevented by the second pawl 196 which upon travel of the rack 172 to the left, is free to upwardly ride on the slanted surface of an adjacent rack tooth and thereafter drop into place against the upright face of such tooth. The second pawl thus prevents the return of the rack to the right. In this manner then, the cassette 170 can be indexed one position at a time to the left (in a second direction), such that each wafer may be sequentially positioned for presentation to the pusher assembly 200 which then serially forces each such aligned wafer into the bracket assembly 26.

The pusher assembly includes a generally L-shaped support 202 connected to the shelf 162 and from which a guide block 204 is mounted. The guide block 204 in turn includes a guide slot 206 in which a thin, elongated pushing element 208 is slidable disposed. The pushing element 208 includes a downwardly extending handle portion 210 in turn connected to the piston 212 of another reciprocating cylinder 214. The cylinder 214 is in turn attached to the shelf 162 and enables the pushing finger or element 208 to reciprocate through the open end of the cassette 170 so as to contact an edge of the wafer W aligned therewith and force such wafer through the opening 60 and into aligned position between pairs of bifurcated contact fingers 36 inwardly extending from the bracket 28. Wafers are accordingly positioned in the bracket for indexing through the various cleaning stations of the present device.

When all of the wafers in the cassette have been loaded or it is otherwise desired to reinitiate the wafer positioning and aligning procedure above described, the handle portion 190 of the first pawl 188 is simply upwardly lifted so that its body portion 192 simultaneously contacts the arm 198 of the second pawl 196. Such action forces both of the rack contacting teeth of the pawls simultaneously out of contact with the rack 172 and enables the rack and the tray 166 attached thereto to be returned to their right-hand and initial loading position by action of the spring 176. Suitable control means 216 and 218 may be respectively positioned with regard to the tray or an extension 220 thereof, and the wafer engaging finger element 208 so as to time and otherwise control the relative movements of the pusher assembly 200 and the positioning assembly 164 with respect to each other.

Wafer Removal or Discharge Station

The construction of the wafer discharge station 58 may be best seen by simultaneous reference to FIGS. 10 through 14 of the drawings wherein an opening 222 through the housing 12 and similar to the opening 174 is provided such that a cassette 224 similar in construction to cassette 170 may be positioned adjacent thereto so as to serially receive the cleaned and dried wafer once such wafers have passed from the drying station 22. The cassette 224 is part of a wafer receiving assembly 226 further including a shelf 228 and a tray 230 essentially similar in construction to the shelf 162 and tray 166 of the previously described wafer loading mechanism. The remaining constructional features of the wafer receiving assembly 226 of the wafer discharge station 58 are essentially similar to the wafer aligning and indexing means 64 of the loading station 56 except that no outwardly mounted pushing element 208 is provided. Instead of such outward mounting of the pushing element 208, a wafer discharge push assembly 232 is provided. Such discharge push assembly 232 includes piston 233 having a shaft 234 supporting a first pusher element 236 at one end thereof. The shaft is linearly reciprocable between a position radially inward of the bracket base to a position radially outwardly thereof. Such configuration is best shown by the transition between the two positions of such pusher element 236 shown in phantom in FIG. 10 of the drawings. The first pusher element or pusher head 236 is provided with a second element or wafer contact element 238 which is pivotally connected thereto as by a pin 240 and spring urged by a coil spring 242 in a counter-clockwise direction about the pusher head element 236 as shown by the direction of the arrow in FIGS. 12 and 13. The wafer contact element 238 is of generally L-shaped configuration and includes a groove 244 at one end thereof adapted for disposition behind and contact with a wafer W. The contact element 238 is provided with a cam element 246 at the other end thereof.

Figure 10:
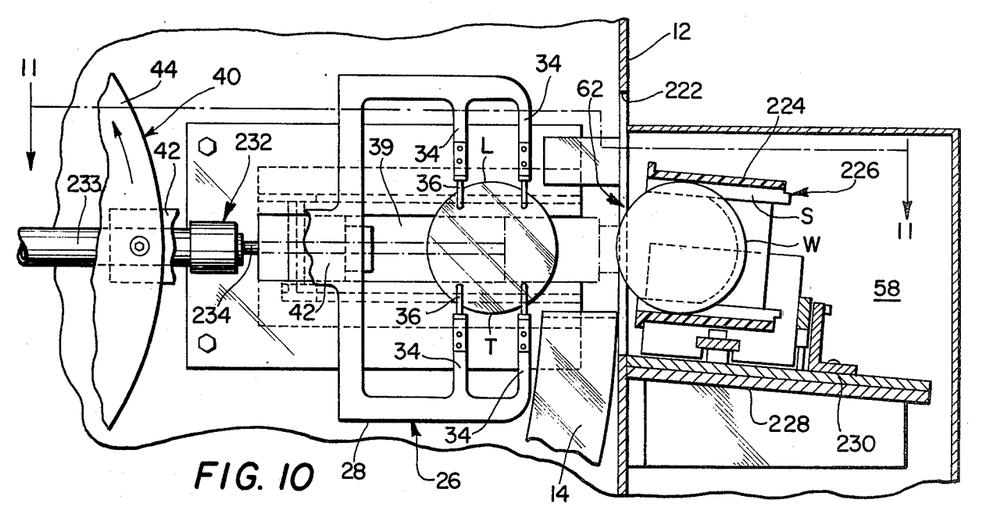
FIG. 10 is an elevational view showing in particular the manner in which cleaned and dried wafers are removed from the travel path of the present device.
Figure 11:
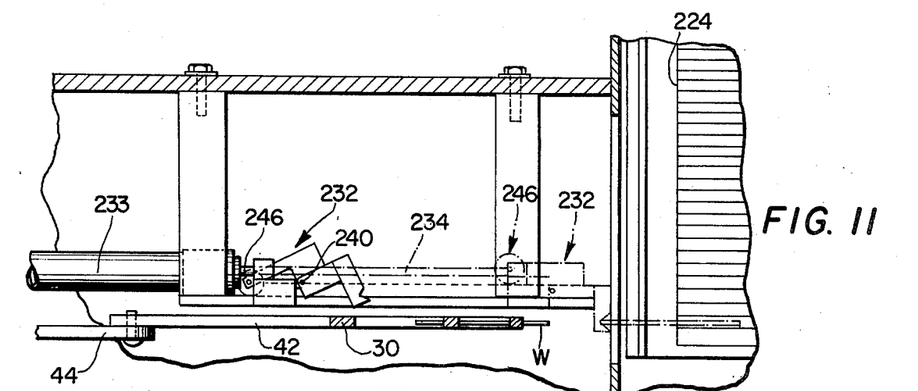
FIG. 11 is a partial top plan view taken along the line 11—11 of FIG. 10.
Figure 13:
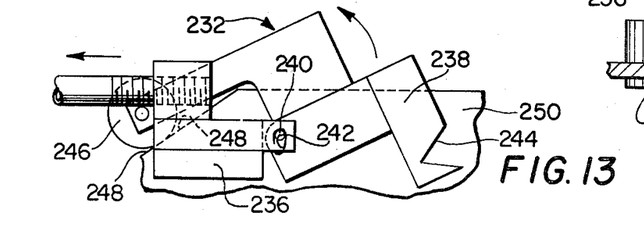
FIG. 13 is a view similar to FIG. 12, but showing the wafer pushing element in its normal spring actuated non-wafer contacting position.
Figure 14:
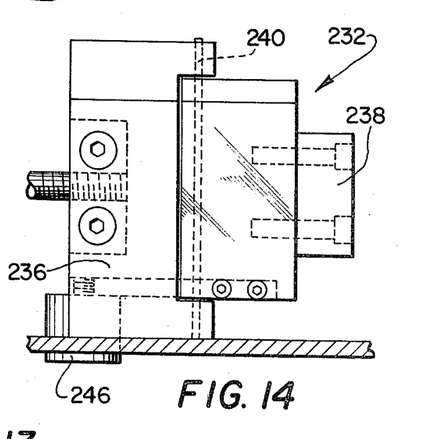
FIG. 14 is a front elevational view of the pusher element shown in FIG. 12.

As best shown in FIG. 10, when the bracket assembly 26 indexes a wafer W adjacent the opening 62 of the track 14, the pusher element 232 is positioned in its retracted position as best shown in FIG. 13. Thereafter, the rod 234 initiates its reciprocal movement radially outwardly or to the right as shown in the drawings such that cam 246 contacts and rides up cam track 248 of a plate 250 so as to overcome the counterclockwise action of the spring 242 and force the wafer pusher contact element 44 in a clockwise direction to a position behind the wafer W, that is, into the space 39 between the base 30 of the U-shaped bracket 28 and the most inwardly radially disposed edge of the wafer W. Further outward radial motion of the shaft 234 enables the V-shaped groove 244 to contact the wafer W and thereafter push such through the openings 62 and 222 into the particular slot S of the cassette 224 in line therewith. Thereafter, the cassette 224 is indexed as explained in relationship to the load station 56 to expose an adjacent slot for receipt of the next serially presented wafer.

Figure 12:
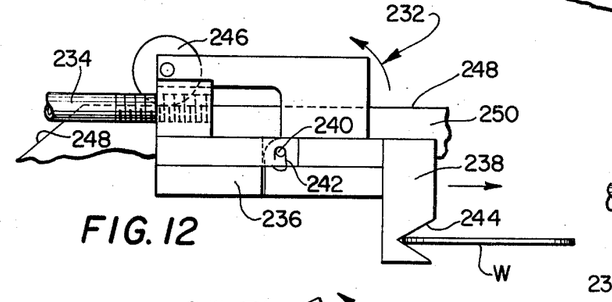
FIG. 12 is an enlarged partial view of the wafer pushing element shown in contacting position with the wafer.

The two-part construction of the pusher element enables such to initially move past the base 30 and thereafter slide into an operative position in front thereof and also behind the wafer. On the return cycle of the shaft 234, the contact of the cam 246 with the level portion of the cam track 248 assures that the pusher contact element 238 will be disposed in its push position as shown in FIG. 12 until the cam 246 contacts the downwardly inclined cam portion 248, whereupon the force of the spring 242 enables the element 238 to be outwardly biased past the base 30 into its normally retracted position therebehind as shown in FIG. 13.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. Apparatus for cleaning material wafers of disc-like form comprising, a frame, an arcuate travel path disposed with respect thereto, said path having a plurality of wafer treatment stations disposed at spaced locations therealong, including a wafer load station, a wafer discharge station and multiple wafer cleaning stations disposed therebetween, said path defined by a track supported by said frame and adapted to contact and at least partially support said wafer while positioned in said cleaning stations, a bracket assembly adapted to receive said wafer in a generally vertical disposition, said bracket assembly including inwardly projecting fingers for supporting said wafer by contacting opposite side edges thereof, and means for indexing said bracket assembly with respect to said track along said path through each of said stations.

2. The apparatus of claim 1, said track including an upper surface having groove means for contacting lower edge portions of said wafer while vertically supported in said travel path.

3. The apparatus of claim 2, said track defining a circular segment, said indexing means including a circular plate centrally disposed radially within said track and adapted for rotational indexing with respect thereto, said plate adapted to support a plurality of circumferentially spaced bracket assemblies so that a plurality of wafers may be simultaneously processed at said plurality of treatment stations.

4. The apparatus of claim 1, said arcuate path being disposed between and below opposite substantially horizontally level positions, said positions respectively corresponding to said load and discharge stations.

5. The apparatus of claim 4, said bracket assembly being a relatively thin member generally coplanar with said track and having a generally U-shaped opening generally radially disposed towards and proximate said track, said load station including means for positioning a wafer in a coplanar attitude with said track into a position adjacent to the beginning of said track but radially outwardly disposed to both said track and said bracket assembly, and pusher means for pushing said indexed wafer past said track and into contact with said bracket assembly.

6. The apparatus of claim 5, said bracket assembly having a pair of fingers inwardly extending towards each other from opposite sides of said U-shaped opening, said wafer being supported by said fingers adjacent said load station and additionally in part by said track during its travel along said path.

7. The apparatus of claim 5, said wafer positioning means including a tray for supporting a supply of wafers disposed in adjacent spaced relationship and including a toothed rack disposed along an outer surface thereof, means for continually urging said tray in a first direction, reciprocating means for urging said tray in a second direction opposite said first direction one tooth at a time, cooperative pawl means adapted to permit operation of said receprocating means and simultaneously prevent tray movement in said first direction and a reciprocal pushing element for transversely contacting a wafer end for postioning said wafer into said bracket assembly.

8. The apparatus of claim 7, said pawl means including a first pawl pivotally connected to said reciprocating means and adapted to engage a tooth in said rack in said second direction and a second pawl pivotally mounted with respect to said rack and spaced from said first pawl in said first direction and in turn adapted to engage a different tooth in said rack to prevent the return of said tray in said first direction.

9. The apparatus of claim 8, wherein said first and second pawls may be simultaneously disengaged from said rack so as to permit said rack to move in said first direction to an original load position thereof.

10. The apparatus of claim 9, said pawls adapted to upwardly pivot in a direction away from said rack, said second pawl having a portion thereof overlying said first pawl whereby upward rack engaging movement of said first pawl simultaneously disengages said second pawl.

11. The apparatus of claim 5, said bracket assembly having a base portion disposed radially inwardly from said track, said wafer adapted to be held by said bracket assembly but spaced from said base thereof, said discharge station including means for receiving a wafer from said bracket assembly, pusher means for pushing said wafer radially outwardly from said bracket assembly through the path of said track into said receiving means, said pusher means including a shaft supporting a first element at one end thereof, said shaft linearly reciprocable between a position radially inward of said bracket assembly base to a position radially outward thereof, said first element having a pusher segment, said pusher segment including a contact portion at one end for engaging said wafer and a cam at the opposite end, and a cam track contacting said cam for urging said pusher segment in a first direction into the space between said bracket assembly base and said wafer once said pusher segment has cleared said bracket assembly base.

12. The apparatus of claim 11, said pusher segment pivotally connected centrally thereof to said first element and spring urged in a second direction relative thereto, whereupon said contact portion is spring urged away from said bracket assembly base on the return stroke of said reciprocable shaft.

13. The apparatus of claim 1, at least one of said cleaning stations including a pair of longitudinally orientated brushes adapted to rotate in opposite directions about parallel longitudinal axes, said wafer adapted for upright disposition between said brushes, said axes adapted for movement from a first position wherein said brushes contact opposite faces of said wafer to a second position wherein said brushes are spaced apart from each other and said wafer.

14. The apparatus of claim 13, said brush axes supported and outwardly projecting from frame means, said frame means having outer frames spaced apart from each other and movable towards and away from each other to correspond to said first and second brush positions, said track disposed between said outer frames such that said bracket assembly may pass therebetween as said bracket assembly is indexed through said stations.

15. The apparatus of claim 14, said cleaning stations including a scrub station, a scrub rinse station, a rinse station and a dry station.

16. The apparatus of claim 15, including means for directing liquid onto said wafer while indexed in said scrub and rinse stations, and sump means for receiving and recycling said liquid.

17. The apparatus of claim 15, including a dry station adjacent said discharge station, said dry station having means for directing a flow of gas across the opposite faces of said wafer in a direction away from said discharge station.

18. The apparatus of claim 14, said brushes mounted on a pair of parallel longitudinally orientated first shafts, said frame means comprising an inner frame and a pair of vertically extending outer frames laterally spaced from each other along said vertical extent, each of said frames having a longitudinally disposed drive shaft supported thereby at the lower end thereof, said drive shafts extending through both said inner and outer frames respectively such that one of said outer frames is mounted for at least limited pivotal movement with respect to the other and said inner frame, means respectively connecting said first shafts with said drive shafts, a fixed position gear attached to each of said outer frames, said gears adapted to contact each other generally along a line between said drive shafts, and drive means for coupling said drive shafts and for positively driving one of said drive shafts.

19. The apparatus of claim 18, wherein both of said outer frames are pivotally mounted.

20. The apparatus of claim 18, said coupling means being a pair of movable gears fixed to said drive shafts and interengaged with each other.

21. The apparatus of claim 20, said outer frames having spaced vertical walls, each of said fixed position gears disposed on one of said outer vertical walls and said movable gears disposed proximate the other outer vertical wall.

22. The device of claim 20, wherein said fixed gears form a pivot point about which the upper ends of said outer frame may move so as to increase the distance therebetween so as to vary the brush spacing between said closed first position and said open second position.

23. The apparatus of claim 22, wherein said drive means includes belt means interconnecting each of the respective drive and first shafts of said outer frames for translating the rotational motion of each of said drive shafts to said brushes.

24. The apparatus of claim 22, wherein at least one of said fixed gears is arcuately adjustable between fixed positions relative its respective outer frame.

25. The apparatus of claim 22, including adjustable stop means positioned at the upper ends of said outer frames for controlling the minimum distance between said brushes and at the bottom ends of said outer frames for controlling the maximum distance between said brushes.

26. The apparatus of claim 13, said track including a discontinuity at one of said cleaning stations, a pair of rollers positioned in said discontinuity and forming a track continuation, said rollers positioned radially below said brushes and contacting said wafer at two arcuately spaced edge locations at the lower half thereof, and means for rotating said rollers so as to independently rotate said wafer within said cleaning station.

27. The apparatus of claim 1, said bracket assembly being a relatively thin member generally coplanar with said track and having a generally U-shaped opening having its open end generally radially disposed towards and proximate said track, said fingers inwardly extending from the opposite sides of said U-shaped opening, said wafer being cooperatively supported by said track and said fingers.

28. The apparatus of claim 27, said fingers each having a terminal pad in turn having bifurcated extensions.

29. The apparatus of claim 28, there being a pair of fingers on opposite sides of said wafer, said wafer adapted to extend between said finger extensions and adapted to contact each of said pads.

* * * * *